US011528813B2

(12) United States Patent
Jeong et al.

(10) Patent No.: US 11,528,813 B2
(45) Date of Patent: Dec. 13, 2022

(54) DISPLAY DEVICE INCLUDING WINDOW MEMBER AND MANUFACTURING METHOD THEREOF

(71) Applicant: Samsung Display Co., Ltd., Yongin-si (KR)

(72) Inventors: Hyang shin Jeong, Hwaseong-si (KR); Jung A Lee, Osan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 183 days.

(21) Appl. No.: 16/723,960

(22) Filed: Dec. 20, 2019

(65) Prior Publication Data

US 2020/0221588 A1 Jul. 9, 2020

(30) Foreign Application Priority Data

Jan. 4, 2019 (KR) ........................ 10-2019-0001348

(51) Int. Cl.
 *H05K 5/00* (2006.01)
 *H05K 5/03* (2006.01)
 *G06F 1/16* (2006.01)
 *G02F 1/1333* (2006.01)

(52) U.S. Cl.
 CPC ..... *H05K 5/0017* (2013.01); *G02F 1/133331* (2021.01); *G06F 1/1637* (2013.01); *H05K 5/03* (2013.01)

(58) Field of Classification Search
 CPC ... G02B 5/00; G02B 5/20; G02B 5/28; G02B 5/287; G02B 5/223; G06F 1/1637; H05K 5/0017; H05K 5/03; G02F 1/133331
 See application file for complete search history.

(56) References Cited

U.S. PATENT DOCUMENTS

| 10,485,119 | B2* | 11/2019 | Do | H05K 5/03 |
| 10,654,304 | B2* | 5/2020 | Goto | B41M 5/24 |
| 10,804,485 | B2* | 10/2020 | Kwon | H01L 51/5237 |
| 2012/0162106 | A1* | 6/2012 | Choi | G06F 1/1637 361/679.01 |
| 2014/0127442 | A1* | 5/2014 | Ryu | H05K 5/0086 427/165 |
| 2014/0178647 | A1* | 6/2014 | Kim | B44F 7/00 428/166 |
| 2014/0233161 | A1* | 8/2014 | Liu | C03C 15/00 65/102 |
| 2015/0319869 | A1* | 11/2015 | Kim | G06F 1/1637 361/748 |

(Continued)

FOREIGN PATENT DOCUMENTS

JP 2003-205375 A 7/2003
KR 10-1161521 B1 7/2012

(Continued)

*Primary Examiner* — Nidhi Thaker
(74) *Attorney, Agent, or Firm* — Lewis Roca Rothgerber Christie LLP

(57) ABSTRACT

A display device includes: a display panel including a display area including a plurality of pixels, and a peripheral area outside the display area; and a window including a transmissive region corresponding to the display area, a non-transmissive region corresponding to the peripheral area, a base, and a first printed layer directly on a first surface of the base, the first printed layer having a cavity, wherein the cavity is in the non-transmissive region.

15 Claims, 12 Drawing Sheets

(56) References Cited

U.S. PATENT DOCUMENTS

| | | | | |
|---|---|---|---|---|
| 2016/0016845 | A1* | 1/2016 | Cho | G06F 1/181 |
| | | | | 216/41 |
| 2016/0349798 | A1* | 12/2016 | Park | G06F 3/04164 |
| 2017/0012235 | A1* | 1/2017 | Kwon | H01L 51/5246 |
| 2017/0147040 | A1* | 5/2017 | Han | G06F 1/1656 |
| 2017/0247289 | A1* | 8/2017 | Waldschmidt | C03C 1/04 |
| 2017/0364172 | A1* | 12/2017 | Kim | G06F 1/1626 |
| 2018/0364758 | A1* | 12/2018 | Jin | G06F 3/041 |
| 2020/0045155 | A1* | 2/2020 | Ha | G02B 5/0808 |

FOREIGN PATENT DOCUMENTS

| | | |
|---|---|---|
| KR | 10-2014-0003046 A | 1/2014 |
| KR | 10-1501427 B1 | 3/2015 |
| KR | 10-1760731 B1 | 7/2017 |

* cited by examiner

DISPLAY DEVICE INCLUDING WINDOW MEMBER AND MANUFACTURING METHOD THEREOF

CROSS-REFERENCE TO RELATED APPLICATION

This application claims priority to and the benefit of Korean Patent Application No. 10-2019-0001348 filed in the Korean Intellectual Property Office on Jan. 4, 2019, the entire contents of which are incorporated herein by reference.

BACKGROUND

1. Field

The present disclosure relates to a display device including a window member (e.g., a window), and a manufacturing method of a display device.

2. Description of the Related Art

Display devices, such as a liquid crystal display (LCD) and an organic light emitting diode display (OLED display), include a display panel including a plurality of pixels configured to display an image and a window member (e.g., a window).

The window member may include a region that is transparent and where light can be transmitted, and a region where light is not transmitted.

The above information disclosed in this Background section is only for enhancement of understanding of the background of the present disclosure and therefore it may contain information that does not form prior art.

SUMMARY

Embodiments of the present disclosure provide enhanced versatility and quality of a design of a printed layer of a window member (e.g., a window).

A display device according to an exemplary embodiment of the present disclosure includes: a display panel including a display area including a plurality of pixels, and a peripheral area outside the display area; and a window including a transmissive region corresponding to the display area, a non-transmissive region corresponding to the peripheral area, a base, and a first printed layer directly on a first surface of the base, the first printed layer having a cavity, and the cavity being in the non-transmissive region.

A second printed layer on the first printed layer may be further included, and a color of the second printed layer may be different from a color of the first printed layer.

The color of the first printed layer may be black, and the color of the second printed layer may be a chromatic or metal color.

The second printed layer may overlap the cavity.

The second printed layer may include a portion that contacts the first printed layer, and the second printed layer may fill a space in the cavity.

At least a portion of the space in the cavity may not be filled with the second printed layer.

A film between the second printed layer and the first printed layer may be further included.

An adhesive layer between the second printed layer and the first printed layer may be further included.

The first surface may face the display panel.

The cavity may be formed by laser patterning.

A display device according to an exemplary embodiment includes: a display panel including a display area including a plurality of pixels, and a peripheral area outside the display area; and a window including a transmissive region corresponding to the display area, a non-transmissive region corresponding to the peripheral area, a base, a first printed layer contacting a first surface of the base, and a second printed layer at a different layer from the first printed layer. The first printed layer has an opening where the first printed layer is removed from the first surface, and the second printed layer overlaps the opening.

A color of the second printed layer may be different from a color of the first printed layer.

The color of the first printed layer may be black, and the color of the second printed layer may be a chromatic or metal color.

The second printed layer may include a portion that contacts the first printed layer, and the second printed layer may fill the opening.

At least a portion of the opening may not be filled with the second printed layer.

A film between the second printed layer and the first printed layer may be further included.

An adhesive layer between the second printed layer and the first printed layer may be further included.

The first surface may face the display panel.

The opening may be formed by laser patterning.

A manufacturing method of a display device according to an exemplary embodiment includes: forming a first printed layer on a first surface of a non-transmissive region of a base; patterning the first printed layer by using a laser to form a cavity; forming a second printed layer on the first printed layer having the cavity; and attaching the base on which the first printed layer and the second printed layer are formed to a display panel comprising a plurality of pixels, wherein the second printed layer overlaps the cavity.

The forming of the first printed layer on the first surface may include deposition, spraying, coating, and/or printing.

The forming of the second printed layer on the first printed layer may include deposition, spraying, coating, and/or printing.

The forming of the second printed layer on the first printed layer may include forming the second printed layer on a film, and attaching the film to the first printed layer.

The method may further include cleaning the base between the forming of the removed portion in the first printed layer and the forming of the second printed layer.

A color of the second printed layer may be different from a color of the first printed layer.

According to exemplary embodiments of the present disclosure, design variety and quality of the printed layer of the window may be increased (or improved).

DETAILED DESCRIPTION

Figure 1:
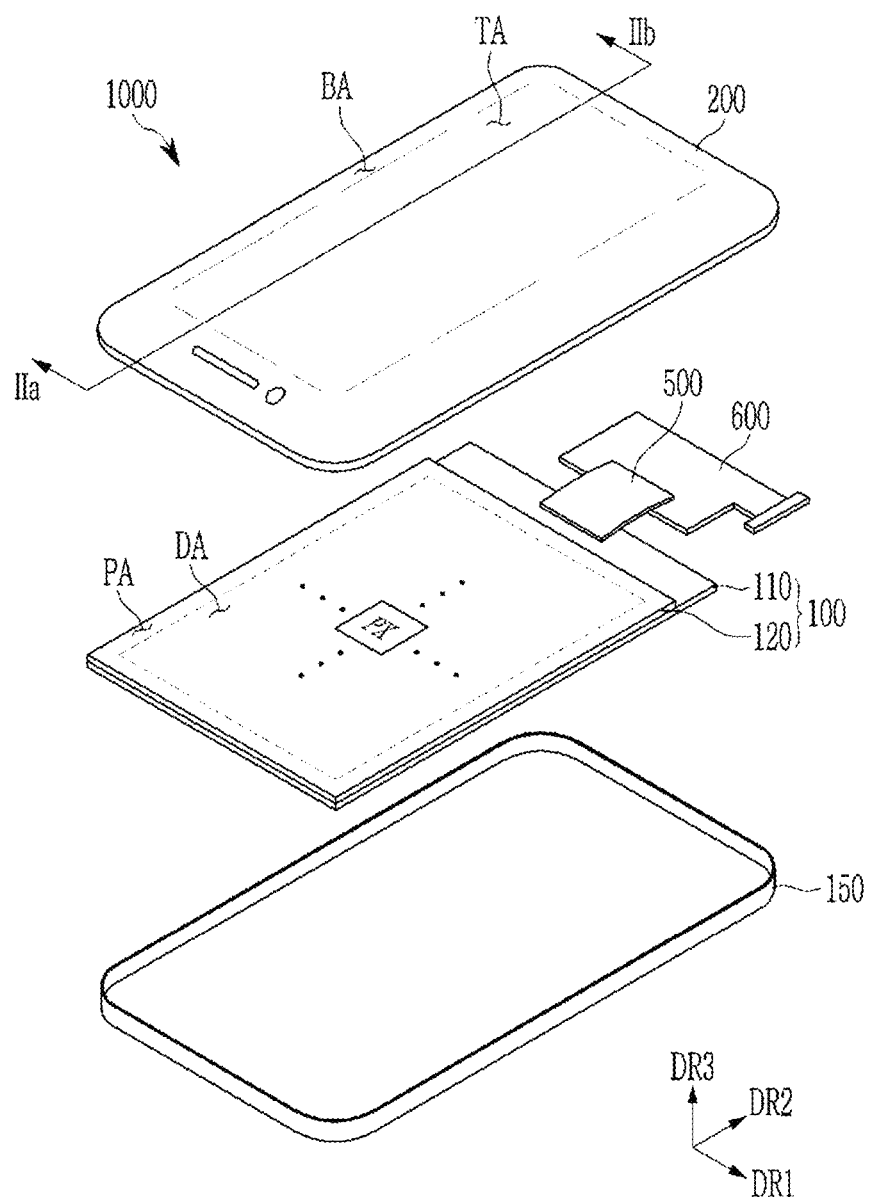
FIG. 1 is an exploded perspective view of a display device according to an exemplary embodiment of the present disclosure.

The present disclosure is described more fully hereinafter with reference to the accompanying drawings, in which exemplary embodiments are shown. As those skilled in the art would realize, the described embodiments may be modified in various different ways, all without departing from the spirit or scope of the present disclosure. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated. In the drawings, the relative sizes of elements, layers, and regions may be exaggerated for clarity.

It will be understood that, although the terms "first," "second," "third," etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the terms "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." In addition, the use of alternative language, such as "or," when describing embodiments of the present disclosure, refers to "one or more embodiments of the present disclosure" for each corresponding item listed. As used herein, the terms "use," "using," and "used" may be considered synonymous with the terms "utilize," "utilizing," and "utilized," respectively. Also, the term "exemplary" is intended to refer to an example or illustration.

Throughout this specification and the claims which follow, a plan view means a view when observing a surface parallel to two directions (e.g., a first direction DR1 and a second direction DR2) crossing each other, and a cross-sectional view means a view when observing a surface cut in a direction (e.g., a third direction DR3) perpendicular (or orthogonal) to the surface parallel to the first direction DR1 and the second direction DR2. Also, to overlap two constituent elements means that two constituent elements are overlapped in the third direction DR3 (e.g., a direction perpendicular to an upper surface of the substrate) unless stated otherwise.

Unless otherwise defined, all terms (including technical and scientific terms) used herein have the same meaning as commonly understood by one of ordinary skill in the art to which the present disclosure belongs. It will be further understood that in commonly used dictionaries, should be interpreted as having a meaning that is consistent with their meaning in the context of the relevant art and/or the present specification, and should not be interpreted in an idealized or overly formal sense, unless expressly so defined herein.

A display device according to an exemplary embodiment is described below with reference to FIG. 1. FIG. 1 is an exploded perspective view of a display device according to an exemplary embodiment of the present disclosure, FIG. 1 shows a portable terminal as a display device 1000 according to an exemplary embodiment of the present disclosure, but the present disclosure is not limited thereto. The portable terminal may be any suitable display device, such as a tablet PC, a smart phone, a personal digital assistant (PDA), a portable multimedia player (PMP), a game machine, a wristwatch electronic device, and the like. However, the display device 1000 according to an exemplary embodiment of the present disclosure is not limited thereto. For example, embodiments of the present disclosure may include a small-sized electronic apparatus, such as a personal computer, a notebook computer, a car navigation unit, a camera, or the like, as well as a television or an external billboard. The foregoing are presented as exemplary embodiments, and embodiments may be employed in other suitable electronic devices without deviating from the concept of the present disclosure.

As shown in FIG. 1, the display device 1000 according to an exemplary embodiment may include a display panel 100, a window member (e.g., a window) 200, and a case member (e.g., a case) 150.

The display panel 100 may include a display area DA as a region configured to display an image, and a peripheral area PA disposed outside the display area DA.

The display area may contain a plurality of pixels PX, which are units configured to display the image. The peripheral area PA may be a region that is not configured to display the image.

The display panel 100 may be a display panel of any suitable display device, such as a liquid crystal display, an organic light emitting diode display, and the like.

The display panel 100 may include a substrate 110 and an encapsulation layer 120. A plurality of signal lines, a plurality of transistors, a plurality of pixel electrodes, etc., may be disposed between the substrate 110 and the encapsulation layer 120. The pixel electrode may be electrically connected to at least one transistor.

For example, when the display panel 100 is a display panel of an emissive display device, a plurality of light-emitting elements may be positioned between the substrate 110 and the encapsulation layer 120.

The light-emitting diode display may include a pixel electrode, a common electrode, and at least one emission layer (e.g., an emissive layer) disposed between the pixel electrode and the common electrode.

The emission layer may be an organic emission layer (e.g., an organic emissive layer) including an organic light emission material (e.g., an organic light emissive material) or an inorganic emission layer (e.g., an inorganic emissive layer) including an inorganic light emission material (e.g., an inorganic light emissive material).

Each pixel PX may have one pixel electrode, but the present disclosure is not limited thereto.

The encapsulation layer 120 may be a substrate and/or may include a plurality of insulating layers. For example, the encapsulation layer 120 may include at least one inorganic insulating layer and at least one organic insulating layer. The encapsulation layer 120 may protect the light-emitting diode display by sealing the light-emitting diode display from the outside.

The encapsulation layer 120 may expose one side of an edge region of the substrate 110 without covering it.

The display panel 100 may have a display surface for displaying the image and a back surface facing the display surface. The display surface may be defined as an upper surface of the encapsulation layer 120, and the back surface may be defined as a lower surface of the substrate 110.

The display surface on which the image is displayed may be generally parallel to a plane defined by the first direction DR1 and the second direction DR2, and a normal direction of the display surface may be defined as the third direction DR3. However, the directions indicated thereby may be changed to other directions as relative concepts.

The window member 200 may overlap with the display panel 100. In FIG. 1, the window member 200 may be disposed on the display panel 100.

The window member 200 may include a transmissive region TA that may be configured to transmit the image provided by the display panel 100, and a non-transmissive region BA that is disposed outside the transmissive region TA. The transmissive region TA may correspond to the display area DA of the display panel 100, and the non-transmissive region BA may correspond to the peripheral area PA of the display panel 100. The non-transmissive region BA may be disposed in the edge region (e.g., a peripheral area) of the window member 200, and the transmissive region TA may be surrounded by the non-transmissive region BA. In other words, the non-transmissive region BA may be around the window 200.

The case member 150 may be disposed under the display panel 100 to house the display panel 100. The case member 150 may be coupled to the window member 200 with the display panel 100 therebetween.

The display device 1000 according to an exemplary embodiment may further include a flexible printed circuit substrate 500.

One end (e.g., a first end) of the flexible printed circuit substrate 500 may be electrically connected to one side (e.g., a first side) of the substrate 110 exposed by the encapsulation layer 120. The flexible printed circuit substrate 500 may be bent toward the back surface of the display panel 100.

The display device 1000 according to an exemplary embodiment may further include a printed circuit board (PCB) 600 electrically connected to the other end (e.g., a second end) of the flexible printed circuit substrate 500.

The PCB 600 may output signals to and receive signals from the display panel 100 via the flexible printed circuit substrate 500. The PCB 600 and/or the second end of the flexible printed circuit substrate 500 may be attached to the lower portion of the substrate 110 in a coupled state as the flexible printed circuit substrate 500 is bent.

The display device 1000 according to an exemplary embodiment may further include a touch unit. The touch unit may be disposed between the window member 200 and the display panel 100. However, the present disclosure is not limited thereto, and the touch unit may be disposed inside the display panel 100 according to some exemplary embodiments. The touch panel may be operated by any suitable method, such as a resistance film type, a capacitance type, and/or an electromagnetic induction type, so that it may detect a touch, hovering, and the like from the outside.

The window member 200 according to an exemplary embodiment of the present disclosure is described below with reference to FIGS. 1-3.

Figure 2:
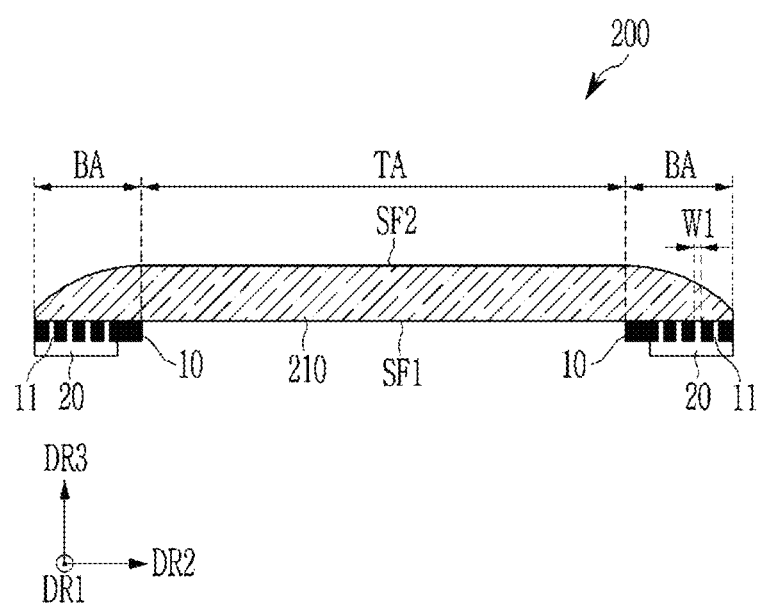
FIGS. 2-3 are cross-sectional views of a window member (e.g., a window) of the display device shown in FIG. 1 taken along the line IIa-IIb of FIG. 1 according to respective embodiments.
Figure 3:
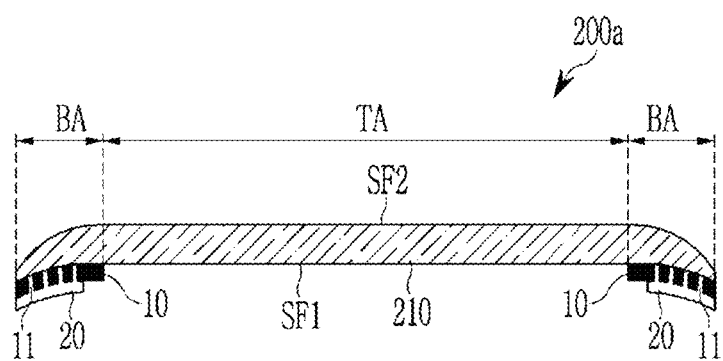
Figure 3:
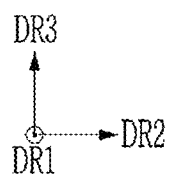

FIGS. 2-3 are cross-sectional views of the window member 200 of the display device 1000 shown in FIG. 1 taken along the line IIa-IIb of FIG. 1 of respective embodiments.

First, referring to FIG. 2, the window member 200 according to an exemplary embodiment may include a base member (e.g., a base) 210 and a first printed layer 10.

The base member 210 may include insulating materials, such as glass, sapphire, and/or plastic.

In a cross-sectional view, the base member 210 may include a first surface (e.g., a lower surface) SF1 and a second surface (e.g., an upper surface) SF2. The lower surface SF1 may be generally flat at a surface facing the display panel 100. A portion of the upper surface SF2 corresponding to the non-transmissive region BA among the upper surface SF2 may be curved, and a portion of the upper surface SF2 corresponding to the transmissive region TA may be substantially flat and extends substantially parallel to the lower surface SF1. For example, the upper surface SF2 corresponding to the lower surface SF1 and the transmissive region TA may be parallel to the plane formed by the first direction DR1 and the second direction DR2.

A thickness of the base member 210 corresponding to the non-transmissive region BA may become thinner (or may be reduced) toward the edge of the base member 210. A portion of the base member 210 corresponding to the transmissive region TA may have a substantially constant thickness.

However, the cross-sectional shape of the base member 210 is not limited thereto, and the upper surface SF2 may be entirely flat (or substantially flat) like the lower surface SF1. In some embodiments, the thickness of the third direction DR3 of the base member 210 may be uniform as a whole (or in its entirety).

The first printed layer 10 may be formed corresponding to the non-transmissive region BA of the window member 200. Also, the first printed layer 10 corresponds to the display area DA of the display device 1000 and may prevent the inside of the display device 1000 from being visible from the outside. The first printed layer 10 may be black or white, but is not limited thereto, and may have various colors such as a chromatic color or a metal color. The first printed layer 10 may have a light blocking function.

The first printed layer 10 may include a resin material, such as an acryl-based resin, an epoxy resin, polyurethane, silicone, etc., which may be mixed with pigments for color implementation.

The first printed layer 10 may be disposed directly on the lower surface SF1 of the base member 210, and may be in contact with the lower surface SF1. Accordingly, in the present exemplary embodiment, the first printed layer 10 may have a generally flat surface along the lower surface SF1 of the base member 210. In addition, according to some embodiments, there is no other layer such as an adhesive layer or a film between the first printed layer 10 and the base member 210.

The first printed layer 10 may be formed by being printed directly on the lower surface SF1 of the base member 210. The first printed layer 10 may be formed on the lower surface SF1 of the base member 210 by any suitable method, such as a spraying process, a deposition process, a coating process, and/or a printing process.

The first printed layer 10 may include a removed portion (e.g., a cavity, an aperture, an opening, etc.) 11 disposed in the non-transmissive region BA. The removed portion 11, as shown in FIG. 2, may form an opening as the first printed layer 10 is removed from the lower surface SF1 of the base member 210. Alternatively, a portion of the first printed layer 10 adjacent to the lower surface SF1 may remain.

The removed portion 11 may form a pattern of the first printed layer 10. The first printed layer 10 including the removed portion 11 is referred to as a patterned first printed layer 10. The first printed layer 10 may be patterned by using a laser.

Accordingly, the first printed layer 10 may be patterned so that the width of the removed portion 11 may be fine, and a width W1 of the removed portion 11 may be minimized as desired. Thus, the variety and quality of the design of the first printed layer 10 may be increased (or improved).

The width W1 of the removed portion 11 may be up to about 0.05 mm. The width W1 means a width in a plane parallel to the first direction DR1 and the second direction DR2.

A second printed layer 20 may be disposed on the first printed layer 10. The second printed layer 20 may be disposed in a different layer than the first printed layer 10. For example, the first printed layer 10 may be disposed between the base member 210 and the second printed layer 20.

The color of the second printed layer 20 may be different from or the same as the color of the first printed layer 10. For example, the second printed layer 20 may have a variety of colors, such as a chromatic or metal color that is different from the color of the first printed layer 10. The second printed layer 20 may also include a metal, such as silver (Ag), thereby reflecting light. The second printed layer 20 may be translucent and may transmit a portion of incident light.

The second printed layer 20 may include a resin material, such as an acryl-based resin, an epoxy resin, polyurethane, silicone, etc., which may be mixed with the pigment for color implementation.

The second printed layer 20 may overlap the removed portion 11 of the first printed layer 10.

As shown in FIG. 2, the second printed layer 20 may fill the space in the removed portion 11 of the first printed layer 10 or may not fill at least a portion of the removed portion 11 of the first printed layer 10. In some embodiments, at least a portion of the removed portion 11 of the first printed layer 10 may be filled with air. For example, in the removed portion 11, the second printed layer 20 and the lower surface SF1 of the base member 210 may be spaced apart.

The second printed layer 20 may be formed by any suitable method, such as a spraying process, a deposition process, a coating process, a printing process, or the like, after the patterning of the first printed layer 10.

According to another exemplary embodiment, the second printed layer 20 may be formed as a film on a plastic film such as PET, and may then be attached to the first printed layer 10. In some embodiments, the film such as PET or the like may be further disposed between the second printed layer 20 and the first printed layer 10, or the second printed layer 20 may be disposed between the PET film or the like and the first printed layer 10.

At least one third printed layer may be disposed on the second printed layer 20. The characteristics of the third printed layer, such as the color and formation method, may be similar to those of the second printed layer 20. For example, the color of the third printed layer may be different from that of the first printed layer 10 and the second printed layer 20.

Referring to FIG. 3, a window member (e.g., a window) 200a according to the present exemplary embodiment is substantially the same as most of the window member 200 shown in FIG. 2, however the shape of the lower surface SF1 of the base member 210 may be different. In the present exemplary embodiment, the lower surface SF1 of the base member 210 may be curved at the non-transmissive region BA. Accordingly, in the present exemplary embodiment, the first printed layer 10 and the second printed layer 20 may have a curved surface along the lower surface SF1 of the base member 210.

A curved direction (or curvature direction) of the lower surface SF1 of the base member 210 may be the same as a curved direction (or curvature direction) of the upper surface SF2.

A curvature radius of the lower surface SF1 of the base member 210 may be different from a curvature radius of the upper surface SF2. For example, the curvature radius of the lower surface SF1 of the base member 210 may be greater than the curvature radius of the upper surface SF2. For example, the thickness of the portion of the base member 210 corresponding to the non-transmissive region BA may become thinner (or smaller) toward the edge of the base member 210.

According to another exemplary embodiment, the curvature radius of the lower surface SF1 of the base member 210 may be substantially equal to the curvature radius of the upper surface SF2.

A manufacturing method of the display device 1000 according to an exemplary embodiment is described below with reference to FIGS. 1-10.

Figure 4:
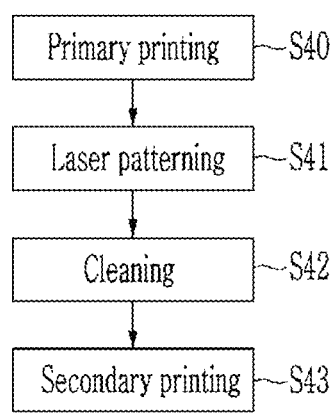
FIG. 4 is a flowchart of a manufacturing method of a window member (e.g., a window) of a display device according to an exemplary embodiment of the present disclosure.
Figure 5:
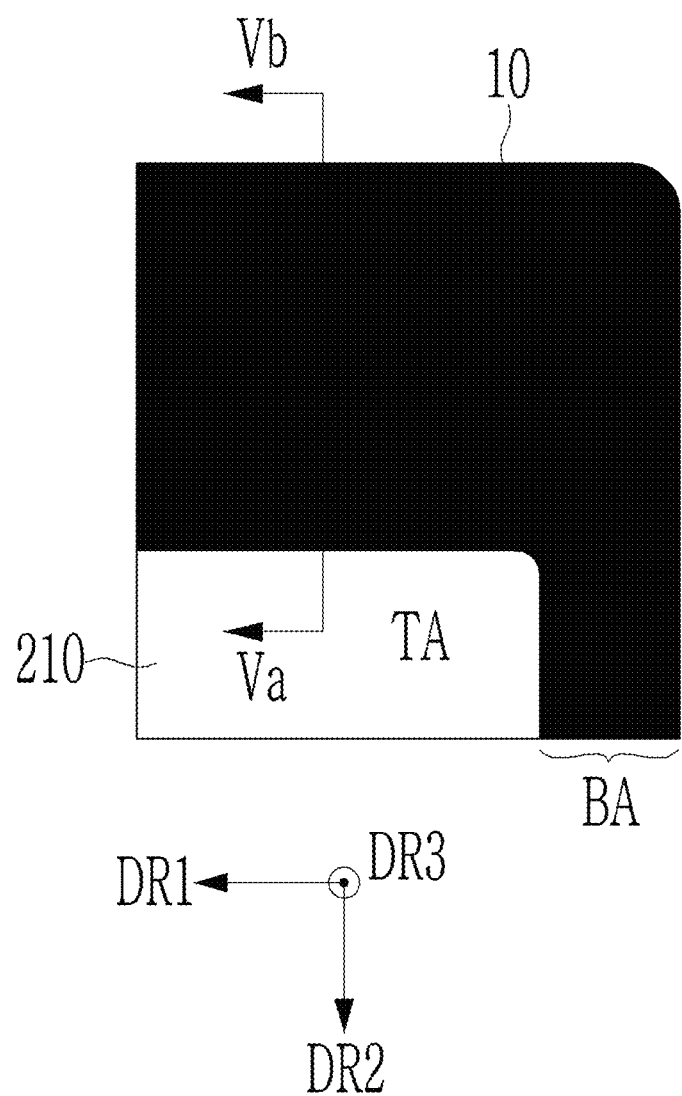
FIG. 5 is a top plan view of a window member (e.g., a window) in a step of a manufacturing method of a window member of a display device according to an exemplary embodiment of the present disclosure.
Figure 6:
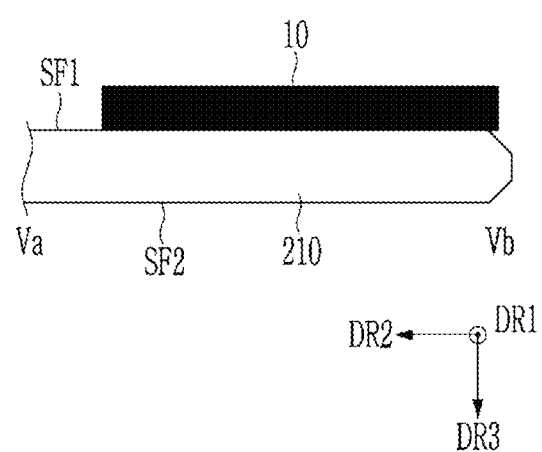
FIG. 6 is a cross-sectional view of the window member shown in FIG. 5 taken along the line Va-Vb of FIG. 5.
Figure 7:
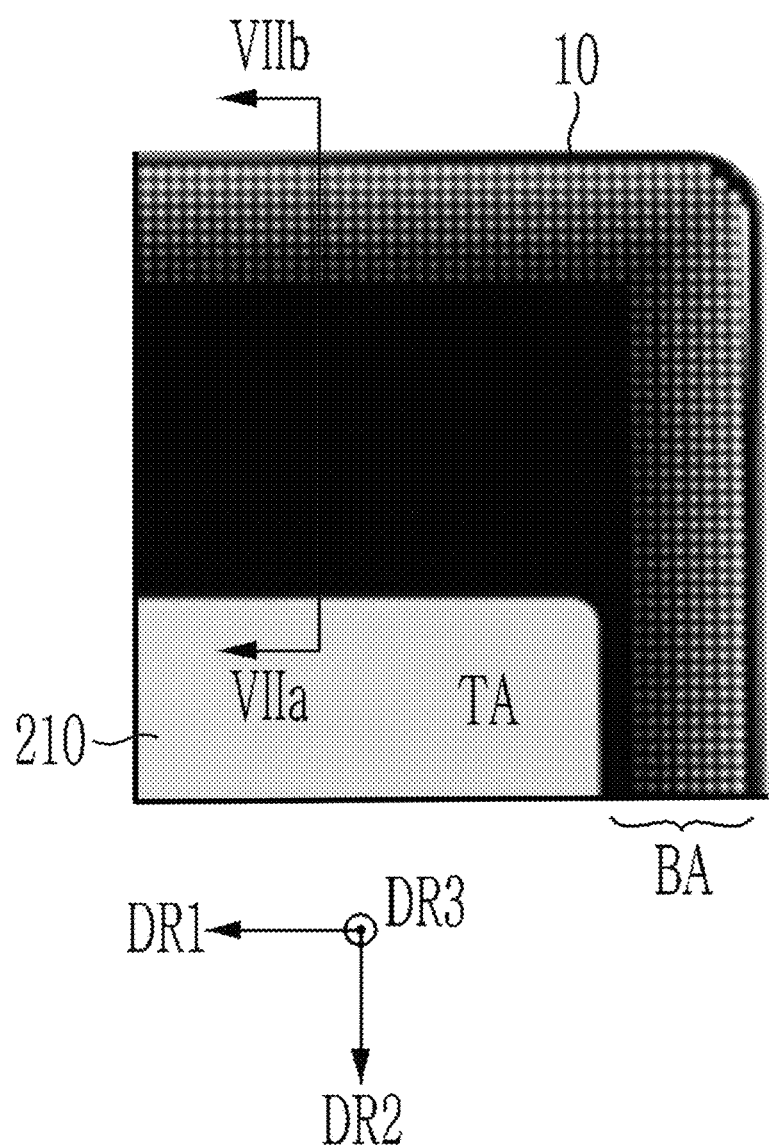
FIG. 7 is a top plan view of a window member in a step of a manufacturing method of a window member (e.g., a window) of a display device according to an exemplary embodiment of the present disclosure.
Figure 8:
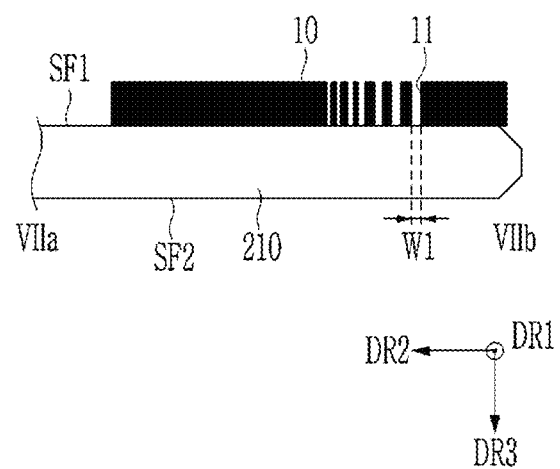
FIG. 8 is a cross-sectional view of the window member shown in FIG. 7 taken along the line VIIa-VIIb of FIG. 7.
Figure 9:
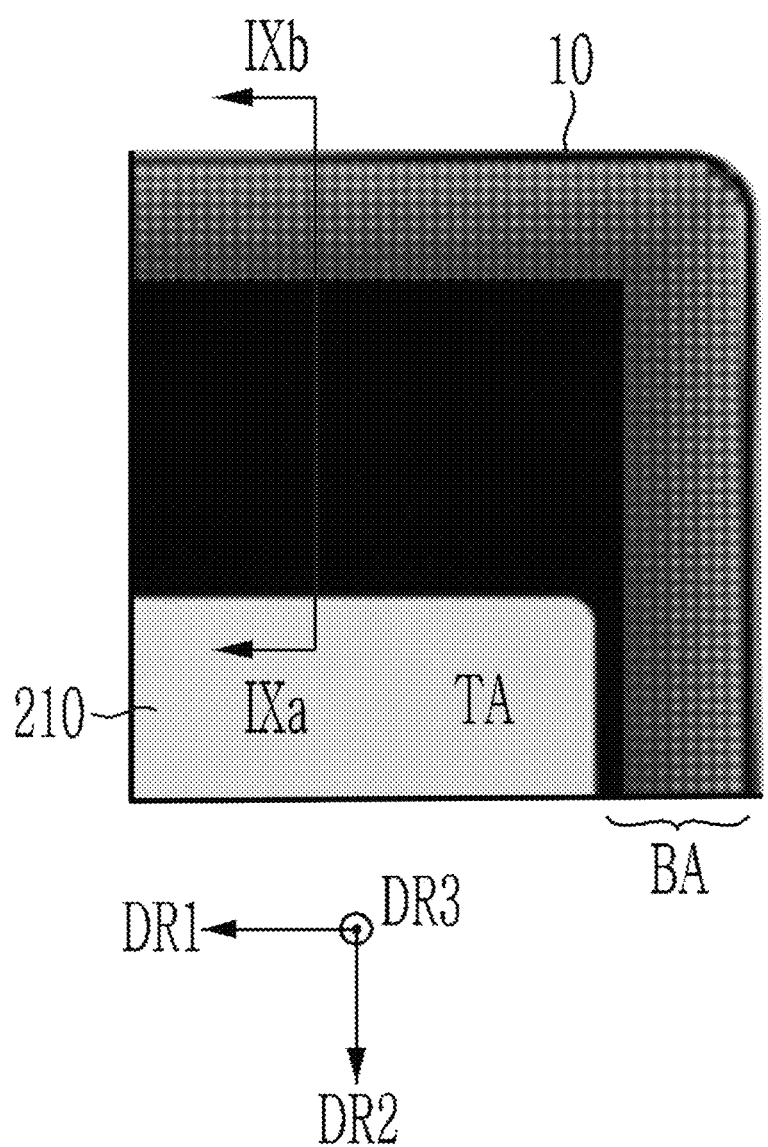
FIG. 9 is a top plan view of a window member (e.g., a window) in a step of a manufacturing method of a window member of a display device according to an exemplary embodiment of the present disclosure.
Figure 10:
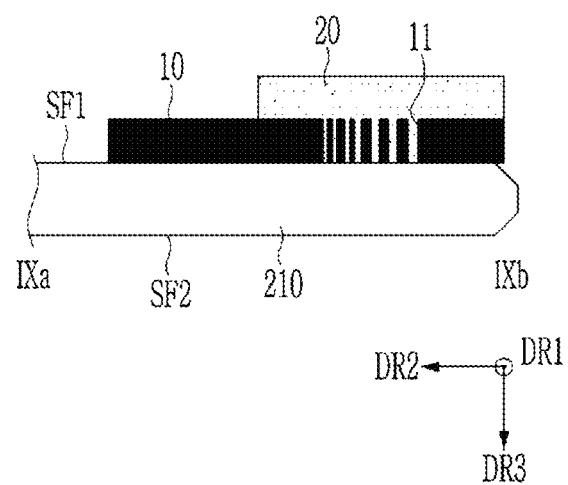
FIG. 10 is a cross-sectional view of the window member shown in FIG. 9 taken along the line IXa-IXb of FIG. 9.

FIG. 4 is a flowchart of the manufacturing method of the window member (e.g., the window) 200/200a of the display device 1000 according to an exemplary embodiment of the present disclosure. FIG. 5 is a top plan view of the window member 200/200a in a step of the manufacturing method of the window member 200/200a of the display device 1000 according to an exemplary embodiment of the present disclosure. FIG. 6 is a cross-sectional view of the window member 200/200a shown in FIG. 5 taken along the line Va-Vb of FIG. 5. FIG. 7 is a top plan view of the window member 200/200a in a step of the manufacturing method of the window member 200/200a of the display device 1000 according to an exemplary embodiment of the present disclosure. FIG. 8 is a cross-sectional view of the window member 200/200a shown in FIG. 7 taken along the line VIIa-VIIb of FIG. 7. FIG. 9 is a top plan view of the window member 200/200a in a step of the manufacturing method of the window member 200/200a of the display device 1000 according to an exemplary embodiment of the present disclosure. FIG. 10 is a cross-sectional view of the window member 200/200a shown in FIG. 9 taken along the line IXa-IXb of FIG. 9.

First, referring to FIGS. 4-6, the first printed layer 10 having a color, such as a black, white, chromatic, or metal color, is formed on the lower surface SF1 of the base member 210, which is made of an insulating material, such as glass, sapphire, and/or plastic (S40). The first printed layer 10 may be formed on the lower surface SF1 of the base member 210 by any suitable method, such as spraying, deposition, coating, printing, or the like. The first printed layer 10 is printed directly on the lower surface SF1 of the base member 210, and is referred to as primary printing.

Referring to FIG. 5, a region where the first printed layer 10 is formed may correspond to the non-transmissive region BA of the window member 200, and a region where the first printed layer 10 is not formed may correspond to the transmissive region TA.

Next, referring to FIG. 4, FIG. 7, and FIG. 8, a laser is irradiated to (or on) at least a portion of the first printed layer 10 to pattern the first printed layer 10 (S41). The portion of the first printed layer 10 that is irradiated with the laser may be removed to form the removed portion (or cavity) 11. As the first printed layer 10 is removed in the removed portion 11 (e.g., as an entire portion of the first printed layer 10 is removed in the removed portion 11), an opening may be formed where the lower surface SF1 of the base member 210 overlaps with the removed portion 11, and a portion of the first printed layer 10 adjacent to the lower surface SF1 may remain in the removed portion 11.

The width W1 of the removed portion 11 of the first printed layer 10 formed by the laser patterning may be reduced to about 0.05 mm.

A shape and arrangement of the removed portion 11 may vary. For example, referring to FIGS. 7-8, the width W1 of the plurality of removed portions 11 included in the first printed layer 10, e.g., a size of the removed portion 11, may vary depending on the position. For example, in a plan view, the width W1 of the removed portion 11 may become larger closer to the edge of the base member 210, but the arrangement and shape of the removed portion 11 is not limited thereto.

Next, referring to FIG. 4, the base member 210 in which the laser patterned first printed layer 10 is formed is cleaned to remove impurities, such as soot particles (S42).

Next, referring to FIG. 4, FIG. 9, and FIG. 10, on the patterned first printed layer 10, a second printed layer 20 having various colors, such as a chromatic or metal color, which may be different from the color of the first printed layer 10, is formed (S43). FIG. 9 shows an example in which the color of the second printed layer 20 is red.

The second printed layer 20 may be formed on the first printed layer 10, for example, by spraying, deposition, coating, printing, or the like. The second printed layer 20 is printed on the first printed layer 10, which is printed on the lower surface SF1 of the base member 210, and may be referred to as secondary printing.

Because the second printed layer 20 overlaps the removed portion 11 of the first printed layer 10, when viewed from the upper surface SF2 side of the base member 210, the removed portion 11 of the first printed layer 10 may be recognized with the different color from that of the first printed layer 10.

Alternatively, the second printed layer 20 may be directly formed on the first printed layer 10, and the second printed layer 20 may be formed on a separate film such as PET by any suitable method, such as spraying, deposition, coating, and/or printing, and then the film may be attached to the first printed layer 10.

According to the present exemplary embodiment, by adjusting the arrangement and/or the shape of the plurality of removed portions 11 and the color of the second printed layer 20, the design of the non-transmissive region BA of the window member 200 may be variously modified and the quality thereof may be increased. For example, because the first printed layer 10 is patterned by using a laser to form the removed portion 11, the width of the removed portion 11 may be fine (or precise) and the various shapes may be easily realized, and the non-transmissive region BA of the window member 200 may be further varied in design and enhanced in quality.

After the formation of the second printed layer 20, at least one third printed layer may be further formed on the second printed layer 20. The third printed layer may be formed directly on the second printed layer 20, for example, by spraying, deposition, coating, printing, or the like, and alternatively, the third printed layer may be formed on a separate film, and then the film may be attached on the second printed layer 20.

As described above, the window member 200/200a on which the first printed layer 10 and the second printed layer 20 are formed may be combined with the display panel 100 to manufacture the display device 1000 according an exemplary embodiment.

Next, the window member 200/200a of the display device according to an exemplary embodiment of the present disclosure is described with reference to FIG. 11.

Figure 11:
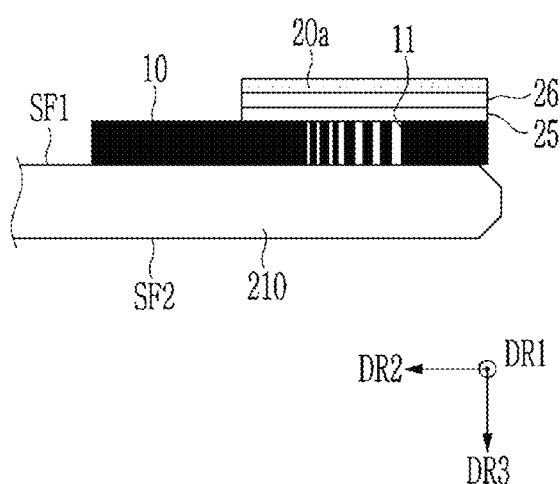
FIG. 11 is a cross-sectional view of a window member (e.g., a window) of a display device according to an exemplary embodiment of the present disclosure.

FIG. 11 is a cross-sectional view of the window member 200/200a of the display device 1000 according to an exemplary embodiment of the present disclosure.

Referring to FIG. 11, the window member 200/200a of the display device 1000 according to the present exemplary embodiment is substantially the same as most of the above-described exemplary embodiment, however a second printed layer 20a may be disposed on the first printed layer 10, and an adhesive layer 25 and a film 26 may be disposed between the second printed layer 20a and the first printed layer 10. The second printed layer 20a may have substantially the same characteristics as the second printed layer 20 described above. The film 26 may be a plastic film such as PET.

According to another exemplary embodiment, a position of the second printed layer 20a and the film 26 in the sectional view may change.

In the exemplary embodiment shown in FIG. 11, the removed portion 11 of the first printed layer 10 may be filled with air.

The manufacturing method of the window member 200/200a of the display device 1000 according to the exemplary embodiment shown in FIG. 11 is substantially the same as most of the manufacturing method of the window member of the display device according to the exemplary embodiment shown in FIGS. 4-10, however the steps after the laser patterning of the first printed layer 10 may be different.

For example, the second printed layer 20a may be formed on a separately provided film 26, and then the film 26 formed with the second printed layer 20a may be attached to the first printed layer 10 through the adhesive layer 25.

Next, an example of various patterns of the printed layer of the window member 200/200a of the display device according to an exemplary embodiment is described with reference to FIG. 12.

Figure 12:
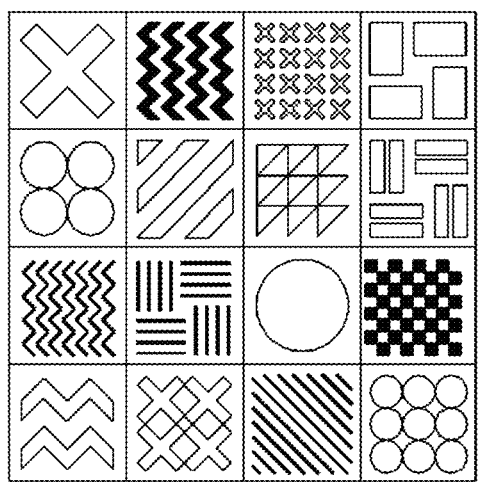
FIG. 12 is a schematic illustration of various examples of a pattern of a printed layer of a window member (e.g., a window) of a display device according to an exemplary embodiment of the present disclosure.

FIG. 12 shows various examples of a pattern of a printed layer of a window member of a display device according to an exemplary embodiment of the present disclosure.

Referring to FIG. 12, the pattern of the first printed layer 10 according to the shape of the removed portion 11 of the first printed layer 10 of the window member 200 according to an exemplary embodiment of the present disclosure may be suitably varied. For example, the first printed layer 10 may have the removed portion 11 forming various patterns, as shown in the drawing of FIG. 12, and these patterns may be repeated and disposed in the first direction DR1 and/or the second direction DR2.

While this disclosure has been described in connection with what is presently considered to be practical exemplary embodiments, it is to be understood that the disclosure is not limited to the disclosed embodiments. On the contrary, it is intended to cover various modifications and equivalent arrangements included within the spirit and scope of the appended claims.

DESCRIPTION OF SOME OF THE SYMBOLS

10: first printed layer
11: removed portion (or cavity)
20: second printed layer
100: display panel
110: substrate
120: encapsulation layer
150: case member
200: window member
200a: window member
210: base member
500: flexible printed circuit substrate
600: printed circuit board (PCB)
1000: display device
TA: transmissive region
BA: non-transmissive region
SF1: lower surface
SF2: upper surface
W1: width

What is claimed is:

1. A display device comprising: a display panel comprising: a display area comprising a plurality of pixels; and a peripheral area outside the display area; a window comprising: a transmissive region corresponding to the display area; a non-transmissive region corresponding to the peripheral area; and a base; a first printed layer directly on a curved first surface of the base, the first printed layer having a cavity that exposes at least a portion of the curved first surface; a second printed layer on the first printed layer; and a film between the second printed layer and the first printed layer, wherein the cavity is in the non-transmissive region, wherein a color of the second printed layer is different from a color of the first printed layer, and wherein the second printed layer overlaps the cavity.

2. The display device of claim 1, wherein the color of the first printed layer is black, and wherein the color of the second printed layer is a chromatic or metal color.

3. The display device of claim 1, wherein the curved first surface faces the display panel.

4. The display device of claim 1, wherein the cavity is formed by laser patterning.

5. A display device comprising: a display panel comprising: a display area comprising a plurality of pixels; and a peripheral area outside the display area; and a window comprising: a transmissive region corresponding to the display area; a non-transmissive region corresponding to the peripheral area; and a base; a first printed layer directly on a first surface of the base, the first printed layer having a first cavity and a second cavity closer to an edge of the base than the first cavity is to the edge of the base, the second cavity being larger in width than the first cavity; a second printed layer on the first printed layer and overlapping the first cavity; and a film between the second printed layer and the first printed layer, wherein the first cavity is in the non-transmissive region, wherein at least a portion of a space in the first cavity is not filled with the second printed layer, and wherein a color of the second printed layer is different from a color of the first printed layer.

6. The display device of claim 5, further comprising an adhesive layer between the second printed layer and the first printed layer.

7. A display device comprising: a display panel comprising: a display area comprising a plurality of pixels; and a peripheral area outside the display area; and a window comprising: a transmissive region corresponding to the display area; a non-transmissive region corresponding to the peripheral area; and a base; a first printed layer contacting a first surface of the base; a second printed layer at a different layer from the first printed layer; and a film between the second printed layer and the first printed layer, wherein the first printed layer has a first opening and a second opening where the first printed layer is removed from the first surface, wherein the second printed layer overlaps the first opening, wherein the second opening is closer to an edge of the base than the first opening is to the edge of the base, the first opening and the second opening being different in width, and wherein a color of the second printed layer is different from a color of the first printed layer.

8. The display device of claim 7, wherein the color of the first printed layer is black, and wherein the color of the second printed layer is a chromatic or metal color.

9. The display device of claim 7, wherein at least a portion of the first opening is not filled with the second printed layer.

10. The display device of claim 7, further comprising an adhesive layer between the second printed layer and the first printed layer.

11. The display device of claim 7, wherein the first surface faces the display panel.

12. The display device of claim 7, wherein the first opening is formed by laser patterning.

13. A method of manufacturing a display device, the method comprising: forming a first printed layer on a curved first surface of a non-transmissive region of a base; patterning the first printed layer by using a laser to form a cavity that exposes at least a portion of the curved first surface; forming a second printed layer on the first printed layer having the cavity; and attaching the base on which the first printed layer and the second printed layer are formed to a display panel comprising a plurality of pixels, wherein the second printed layer overlaps the cavity, wherein the forming of the second printed layer on the first printed layer comprises: forming the second printed layer on a film; and attaching the film to the first printed layer, and wherein a color of the second printed layer is different from a color of the first printed layer.

14. The method of claim 13, wherein the forming of the first printed layer on the curved first surface comprises deposition, spraying, coating, and/or printing.

15. The method of claim 13, further comprising cleaning the base between the forming of the cavity in the first printed layer and the forming of the second printed layer.

* * * * *